(12) United States Patent
Arnold et al.

(10) Patent No.: US 10,998,605 B2
(45) Date of Patent: May 4, 2021

(54) CONNECTING UNIT FOR CONNECTING TO FIRST AND SECOND INTERFACES, WHERE THE CONNECTING UNIT COMPRISES AN INTERNAL CONDUCTOR DISPOSED WITHIN A HOUSING FORMED BY HALF-SHELL CONSTRUCTION

(71) Applicant: Tesat-Spacecom GmbH & Co. KG, Backnang (DE)

(72) Inventors: Christian Arnold, Backnang (DE); Andreas Wacker, Remshalden (DE); Andreas Fisher, Backnang (DE); Michael Glasbrenner, Winnenden (DE); Florian Essig, Sachsenheim (DE); Daniel Reicherter, Stuttgart (DE); David Diez, Ludwigsburg (DE); Andreas Scheffel, Auenwald (DE); Patrick Thiemer, Winnenden (DE)

(73) Assignee: Tesat-Spacecom GmbH & Co. KG

( * ) Notice: Subject to any disclaimer, the term of this patent is extended or adjusted under 35 U.S.C. 154(b) by 148 days.

(21) Appl. No.: 16/159,889

(22) Filed: Oct. 15, 2018

(65) Prior Publication Data
US 2019/0123447 A1    Apr. 25, 2019

(30) Foreign Application Priority Data
Oct. 25, 2017 (DE) .................. 10 2017 124 974.5

(51) Int. Cl.
*H01P 5/02* (2006.01)
*H01P 3/06* (2006.01)
(Continued)

(52) U.S. Cl.
CPC ............... *H01P 5/026* (2013.01); *H01P 1/02* (2013.01); *H01P 1/045* (2013.01); *H01P 3/06* (2013.01);
(Continued)

(58) Field of Classification Search
CPC .. H01P 5/026; H01P 1/045; H01P 3/06; H01P 5/103; H01P 11/005
(Continued)

(56) References Cited

U.S. PATENT DOCUMENTS 4,641,140 A * 2/1987 Heckaman et al. .......... H01Q 21/0075
333/236
5,021,734 A    6/1991 Tuttle
(Continued)

FOREIGN PATENT DOCUMENTS

| EP | 2 775 612 A1 | 9/2014 |
| FR | 2461369 A1 | 1/1981 |
| JP | H11-243302 A | 9/1999 |

OTHER PUBLICATIONS

Search Report for French Patent Application FR1859758 dated Nov. 21, 2019.

*Primary Examiner* — Benny T Lee
(74) *Attorney, Agent, or Firm* — Lerner, David, Littenberg, Krumholz & Mentlik, LLP

(57) ABSTRACT

A connecting unit for radio-frequency components has: a housing; a first interface and a second interface which are arranged on the housing and are designed to be coupled to in each case one radio-frequency component; an internal conductor which runs in the housing and is connected to the first interface and the second interface in order to establish a radio-frequency connection between the first interface and the second interface; a spacer which surrounds the internal conductor and extends at least along a portion of the length of the internal conductor. The housing is manufactured from an electrically conductive and rigid material and the spacer is arranged such that the internal conductor is at a distance from the housing at least in sections.

11 Claims, 5 Drawing Sheets

(51) Int. Cl.
*H01P 1/02* (2006.01)
*H01P 1/04* (2006.01)
*H01P 5/08* (2006.01)
*H01P 5/10* (2006.01)
*H01P 5/103* (2006.01)
*H01Q 1/50* (2006.01)
*H01Q 13/22* (2006.01)
*H01Q 13/24* (2006.01)
*H01L 23/66* (2006.01)

(52) U.S. Cl.
CPC .............. *H01P 5/087* (2013.01); *H01P 5/103* (2013.01); *H01P 5/1022* (2013.01); *H01Q 1/50* (2013.01); *H01Q 13/22* (2013.01); *H01Q 13/24* (2013.01); *H01L 23/66* (2013.01)

(58) Field of Classification Search
USPC ........................................................ 333/245
See application file for complete search history.

(56) References Cited

U.S. PATENT DOCUMENTS

| | | | |
|---|---|---|---|
| 5,959,506 A * | 9/1999 | Aves | H01P 1/02 333/245 |
| 9,530,604 B2 | 12/2016 | Katz et al. | |
| 2011/0306237 A1* | 12/2011 | Yagisawa et al. | H01R 24/44 439/578 |
| 2016/0149286 A1 | 5/2016 | Mass et al. | |
| 2017/0222295 A1* | 8/2017 | Uher et al. | H01P 1/202 |

\* cited by examiner

CONNECTING UNIT FOR CONNECTING TO FIRST AND SECOND INTERFACES, WHERE THE CONNECTING UNIT COMPRISES AN INTERNAL CONDUCTOR DISPOSED WITHIN A HOUSING FORMED BY HALF-SHELL CONSTRUCTION

FIELD OF THE INVENTION

The present invention relates to radio-frequency technology. In particular, the invention relates to a connecting unit for radio-frequency devices and also to a radio-frequency unit or radio-frequency assembly comprising a connecting unit of this kind. The invention further relates to a satellite comprising a radio-frequency unit of this kind, wherein the radio-frequency unit can be used, for example, as part of a communication device or a data transmission link, in particular a satellite transmission link or a satellite radio transmission link.

BACKGROUND TO THE INVENTION

Systems from the field of radio-frequency technology are used in order to transmit signals and data from a transmitter system to a receiver system. Radio-frequency technology is used preferably when data has to be transmitted over a large distance (up to several hundred or several thousand kilometers).

Before signals are passed to an air interface (for example, an antenna), they may, for example, need to be processed or conditioned. Radio-frequency technology is employed, for example, in communication satellites in order to amplify, to combine and to filter communication signals. A radio-frequency system often comprises individual modules (filter, coupler, insulators, preamplifier, power amplifier etc.) which are connected to one another.

European patent publication EP 2 775 612 A1 and U.S. Pat. No. 9,530,604 B2 describe a signal transmission unit which is employed in the radio-frequency range and is used in a communication satellite in particular.

SUMMARY OF THE INVENTION

An aspect of the invention may provide a connection technology for modular radio-frequency systems which can be employed in a flexible manner.

A first aspect specifies a connecting unit for radio-frequency components. The connecting unit has a housing, a first interface, a second interface, an internal conductor and a spacer. The first interface and the second interface are arranged on the housing and are designed to be coupled to a first radio-frequency component and a second radio-frequency component, respectively. The internal conductor is located within the housing and is connected to the first interface and the second interface in order to establish a radio-frequency connection between the first interface and the second interface. The spacer surrounds the internal conductor and extends at least along a portion of the length of the internal conductor. The housing is manufactured from an electrically conductive and rigid material and the spacer is arranged such that the internal conductor is at a distance from the housing at least in sections.

The connecting unit described in this document is mechanically robust, cost-effective, can be integrated into existing housings of the radio-frequency components to be connected, is lightweight and compact, suitable for low and high input powers and also for direct connections and also power distribution and is also suitable in order to connect differently positioned or arranged radio-frequency components to one another.

Therefore, coaxial cables or waveguides can be dispensed with. The connecting unit described here is mechanically considerably more robust and rigid in comparison to coaxial cables and is suitable for larger bandwidths in comparison to waveguides and also provides a higher degree of flexibility in respect of the arrangement of the radio-frequency components to be connected.

The two interfaces are preferably arranged on an outer face of the housing and are at a distance from one another, so that the radio-frequency components to be connected can be connected to one another by means of the connecting unit.

The housing is preferably manufactured from a rigid material. This means that the housing does not substantially change its shape under the influence of its own weight and is also able to withstand external loads, in particular mechanical loads. The rigid material of the housing can be, for example, aluminum.

Since the housing is manufactured from an electrically conductive material, the housing serves as a shield for the internal conductor, so that the housing serving as a shield minimizes or even eliminates an influence of external electromagnetic fields on the signal transmission by means of the internal conductor.

The internal conductor can have a certain degree of inherent strength which holds the internal conductor in a specific position within the housing. However, the spacer is provided as a further element in order to fix and to position the internal conductor in the housing. The spacer is manufactured from an electrically insulating material and fixes the internal conductor relative to the housing. The spacer can be designed, for example, in a disc shape or plate shape and have a centrally arranged recess through which the internal conductor runs. The outer faces of the spacer bear against the inner walls of the housing. The spacer preferably bears directly against the inner walls of the housing and there is no gap therebetween, in order to prevent movement of the spacer in the housing. The spacer can be manufactured from an elastically deformable material. This material can serve, in particular, to capture manufacturing and mounting tolerances.

The internal conductor is coupled to the first and the second interface. The internal conductor comes close to the housing wall at the corresponding coupling points. However, the internal conductor is at a distance from the walls of the housing between these coupling points.

In the context of this description, radio-frequency is understood to mean a frequency range above 1 GHz (gigahertz, $1\times10^9$ Hertz). Frequency ranges of this kind are used, for example, in satellite radio transmission links. A satellite radio transmission link of this kind may be, for example, a Ka band transmission link in a frequency range of from 17.7-21.2 GHz for the downlink and 27.5-31 GHz for the uplink, a Ku or X band implementation in the region around 11 GHz or, respectively, 7 GHz, or an L band (around 1.5 GHz), S band (around 2.5 GHz) or C band implementation (around 4 GHz).

According to one embodiment, the housing comprises two half-shells which are connected to one another along a joint, wherein the housing is at least partially composed of aluminum.

Aluminum is comparatively lightweight and has a sufficiently high strength in order to protect the connecting unit, in particular the internal conductor, against mechanical damage. Furthermore, aluminum is electrically conductive in order to serve as an electromagnetic shield for the internal conductor.

The housing can comprise two half-shells or, in general, at least two shells which are joined together and connected to one another in order to keep the housing in its desired shape. The half-shells form a hollow space in which the internal conductor is located. The internal conductor extends in the hollow space of the housing from one interface to the other. In the process, the internal conductor can adapt to a shape of the housing. For example, it is possible that the internal conductor has a bent or kinked profile. For example, the internal conductor can extend such that the internal conductor is at a uniform distance from the inner walls of the housing. As an alternative, the internal conductor can extend such that the internal conductor is at the maximum distance from the inner walls of the housing. This means that the distance from two opposite inner walls is the same.

According to a further embodiment, the internal conductor is composed of an electrically conductive material, wherein the electrically conductive material contains at least one of the following materials or a combination of the said materials: aluminum, brass, copper, silver, gold.

The internal conductor serves to transmit radio-frequency electrical signals. Good electrical conductivity is therefore advantageous in order to transmit signals of this kind with as little corruption as possible.

The internal conductor is preferably produced from a solid material, that is to say is not hollow.

According to a further embodiment, the internal conductor comprises at least two subsections which are connected to one another by means of a connection.

This division of the internal conductor into several subsections which can be detached from one another allows for modular assembly of the internal conductor. Therefore, angled connections can be produced, without a continuous internal conductor having to be angled.

According to a further embodiment, the connection between the subsections of the internal conductor is a force-fitting or frictional connection.

Therefore, the connection can be, for example, a clamping or plug-in connection. This type of connection has the advantage that, in the event of thermal expansion of the internal conductor or a relative movement of the interfaces on the housing or the connected radio-frequency components in relation to one another, the clamping or plug-in connection allows a certain degree of compensation for this expansion or movement. As an alternative, the connection can also be a screw connection.

According to a further embodiment, a surface of the internal conductor is coated with a layer of silver or gold.

In other words, the internal conductor is therefore silver-plated or gold-plated. This can improve the electrical conductivity. The internal conductor is preferably completely coated with silver or gold. The layer of silver or gold can be a few μm thick.

According to a further embodiment, the spacer contains an electrically insulating material.

Therefore, the internal conductor is electrically insulated or isolated from the housing. It should be noted that the first and the second interface are also arranged on the housing or coupled to the housing such that the interfaces are electrically insulated from the housing.

According to a further embodiment, the spacer extends over the entire length of the internal conductor and holds the internal conductor at a prespecified position in the housing.

Therefore, the spacer has the purpose of fixing the internal conductor relative to the housing and of electrically isolating or insulating the internal conductor from the housing.

According to a further embodiment, the electrically insulating material of the spacer is a plastic, in particular a polyether ketone or a polytetrafluoroethylene, available, for example, under brand name TEFLON®.

These electrically insulating materials have proven effective particularly for use in a vacuum and are therefore advantageous for use on board a satellite which is operated outside the Earth's atmosphere.

According to a further embodiment, the connecting unit further has a radio-frequency component which is located in the housing and is arranged between two sections of the internal conductor and also is electrically connected to these two sections.

This means that a radio-frequency component can be integrated in the housing of the connecting unit in order to be connected to other radio-frequency components, which are arranged outside the housing, by means of the internal conductor.

This radio-frequency component which is arranged in the housing can be, for example, a power amplifier which is electrically connected to two sections of the internal conductor, so that one connection of the power amplifier is routed to one interface of the housing.

The two sections of the internal conductor are connected to the power amplifier, preferably by means of strip lines (microstrips). In this case, the sections of the internal conductor are electrically connected to the respectively associated strip lines.

This design has the advantage that the radio-frequency component which is arranged in the housing is likewise protected against external mechanical influences and also electromagnetic fields.

According to a further embodiment, the first interface is a coaxial connector or a waveguide and the second interface is likewise a coaxial connector or a waveguide.

Therefore, the first interface and the second interface are outer interfaces by means of which the internal conductor can be coupled to a radio-frequency component or an interface of the radio-frequency component.

The first interface and the second interface can be identical or different. Therefore, for example, the first interface can be a coaxial connection and the second interface can be a waveguide connection. In general, this means that the first interface and the second interface can be adapted to the first radio-frequency component and the second radio-frequency component to be connected, respectively. Therefore, the connecting unit provides a flexible way of also connecting radio-frequency components having different interfaces to one another.

A further aspect specifies a radio-frequency unit. The radio-frequency unit has a first radio-frequency component and a second radio-frequency component and also a connecting unit as described above and in the description which follows, wherein the connecting unit electrically connects the first radio-frequency component and the second radio-frequency component to one another.

The connecting unit can be adapted to the spatial conditions and the relative arrangement of the first radio-frequency component and the second radio-frequency component by virtue of the housing of the connecting unit being adapted to the requirements of the environment in which it is to be used before being mounted.

According to one embodiment, the first radio-frequency component is a preamplifier and the second radio-frequency component is a power amplifier.

Preamplifiers and power amplifiers are preferably used in communication connections which bridge large distances. Due to the arrangement of preamplifiers and power amplifiers, a signal is provided in the desired form.

However, the radio-frequency components may also be filters, multiplexers, circulators or insulators which can be connected to one another with the aid of the connecting unit described in this document.

A further aspect specifies a satellite comprising a radio-frequency unit as described above and in the text which follows.

The satellite may be a communication satellite. A communication satellite is a spacecraft which is provided for use in orbit and contains a communication system for receiving and transmitting data and/or signals. In addition, a communication satellite can also contain units for processing the data. The radio-frequency unit can preferably be used in a signal-processing path of the communication system of the communication satellite.

BRIEF DESCRIPTION OF THE DRAWINGS

Exemplary embodiments of the invention will be discussed in more detail below with reference to the appended drawings. The illustrations are schematic and not to scale. Identical reference symbols relate to identical or similar elements. In the drawings.

DETAILED DESCRIPTION OF THE INVENTION

Figure 1:
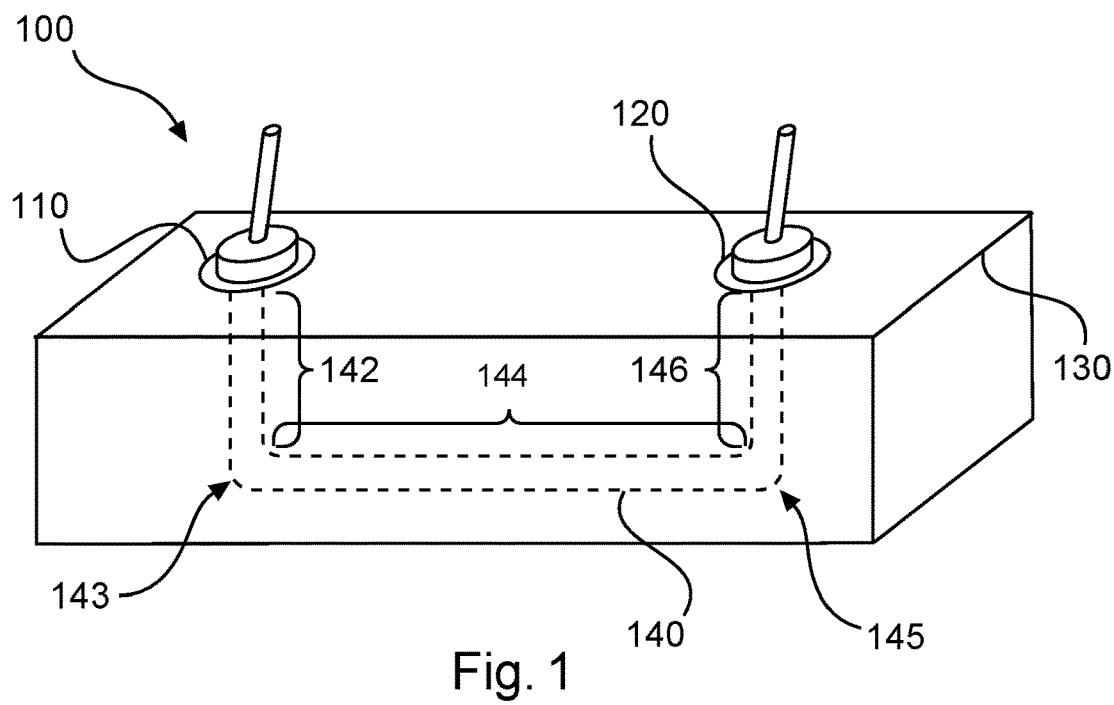
FIG. 1 shows a schematic isometric illustration of a connecting unit according to one exemplary embodiment.

FIG. 1 shows a connecting unit 100. The connecting unit 100 has a housing 130, a first interface 110 and a second interface 120. The first interface and the second interface are arranged on a wall or outer side of the housing 130 and are respectively mechanically coupled thereto. The connecting unit 100 further has an internal conductor 140, wherein the internal conductor 140 extends within the housing 130 and electrically connects the first interface 110 to the second interface 120, so that electrical signals can be transmitted from the first interface to the second interface.

Although FIG. 1 illustrates that the first interface and the second interface are located on the same side or face of the housing 130, it should be noted that the first interface and the second interface can be located on different sides of the housing 130. The location in which the first interface and the second interface are located with respect to the housing 130 can depend on where and/or how the radio-frequency components to be connected to one another are arranged.

It should further be noted that the housing 130 can assume different outer shapes. In FIG. 1, the housing is shown as a cuboid, however it can equally be L-shaped or U-shaped. The housing 130 is manufactured from an electrically conductive material or contains a material of this kind. As a result, the interior of the housing 130 is shielded against electromagnetic fields.

The internal conductor 140 is located within the housing 130 and is illustrated using dashed lines in FIG. 1. The internal conductor 140 is electrically and mechanically coupled to the first interface 110 and the second interface 120. The internal conductor 140 is manufactured from metal or contains a metal, in particular aluminum, brass or copper, and can be silver-plated or gold-plated.

The internal conductor 140 can have a plurality of sub-sections. In the example of FIG. 1, the internal conductor 140 has a first section 142, a second section 144 and a third section 146. These sections are mechanically and also electrically coupled to one another. The division of the internal conductor into a plurality of sections allows for the internal conductor to be assembled in a modular manner. The internal conductor can be assembled such that it corresponds to the shape of the housing 130.

Figure 9:
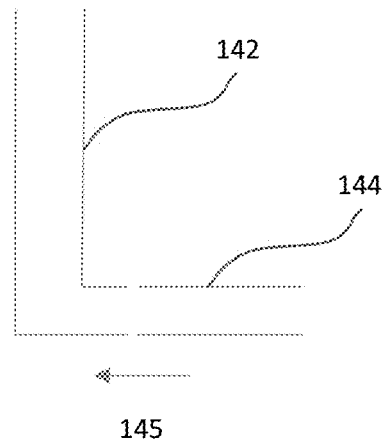
FIG. 9 shows a schematic illustration of a connection between two sections of an internal conductor according to an embodiment.

Connections 143, 145 are provided between the sections 142, 144, 146 of the internal conductor 140. These connections may be, for example, a plug-in connection, a clamping connection or a screw connection, as schematically represented by connection 145 in FIG. 9. A plug-in connection and a clamping connection in particular have the advantage that the connection can absorb thermally-induced expansions or any other movement of the internal conductor 140, of the housing 130 or of the radio-frequency components to be connected to one another since they allow relative movement of the connected sections, without the electrical connection being released or disconnected in the process.

In the case of a plug-in connection, the section 142 can have, for example, a recess (not shown) and the section 144 can have a pin (not shown) which is inserted into the recess. A screw connection can be of similar construction, wherein the pin can be provided with an external thread and the recess in the other section is a hole through which the pin is routed. In this case, the pin is longer than the material thickness of the other section, so that a nut can be screwed onto the external thread of the pin.

The first interface 110 and the second interface 120 can be arranged and fixed, for example, in a bore or in another aperture of the wall of the housing 130. This is done in such a way that the first interface 110 and the second interface 120 are electrically insulated with respect to the housing 130.

Figure 10:
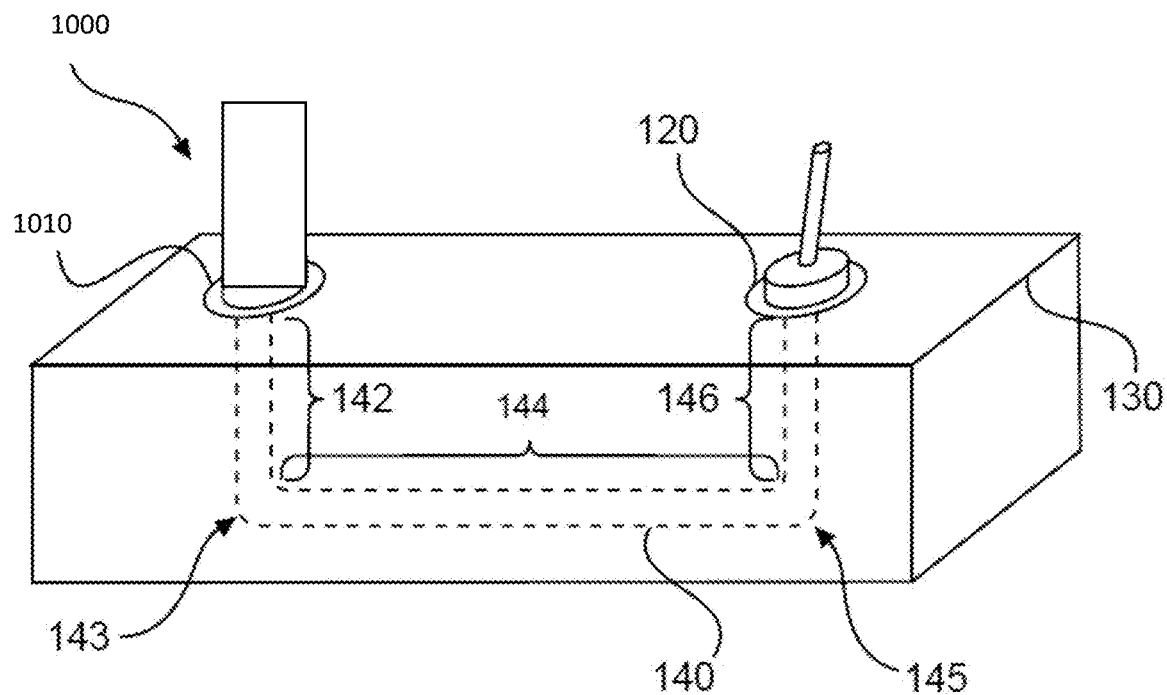
FIG. 10 shows a schematic illustration of a connecting unit having a waveguide as an interface according to an embodiment.

In other words, the connecting unit 100 can be described as follows: the connecting unit 100 substantially comprises a metal external housing which is provided as a separate housing 130 or can be integrated into the housing of the existing radio-frequency components. An internal conductor 140 which is held and routed either completely or at irregular intervals by spacers 150 (see FIG. 2) is routed in this housing 130. The internal conductor can be connected to microstrip substrates by direct bonding (see FIG. 5). The internal conductor 140 can be connected to a waveguide or to a coaxial connection by means of the first and the second interface 110, 120. A simple plug can be fitted for the purpose of connecting coaxial conductors or coaxial lines. The first interface and the second interface can have a flange at their coupling points to the external radio-frequency components to be connected and can be connected to the radio-frequency components by means of plug-in or screw connections. FIG. 10 illustrates a connecting unit 1000, wherein a first interface 1010 is a waveguide, whereas the second interface 120 may be similar to the second interface of the connecting unit 100 of FIG. 1. Likewise, the housing 130, the internal conductor 140 including the sections 142, 144, 146 and the connections 143, 145, may be similar to the corresponding elements of the connecting unit 100 of FIG. 1.

The connecting unit 100 is mechanically very robust and the connection of horizontal and vertical modules is possible without problems. In this case, the connecting unit is distinguished by low losses which are, in particular, lower than the losses of a cable. The connecting unit is suitable for directly connecting two radio-frequency components or else for distributing power from an input to two outputs (see FIG. 5). Therefore, the connecting unit is suitable for modular structures because the connecting unit allows any desired number of devices to be connected. The internal conductor 140 can also be divided at appropriate points in order to allow simpler construction (for example bonding to radio components). The sections of the internal conductor can be connected to one another with the aid of plug-in or screw contacts.

Figure 2:
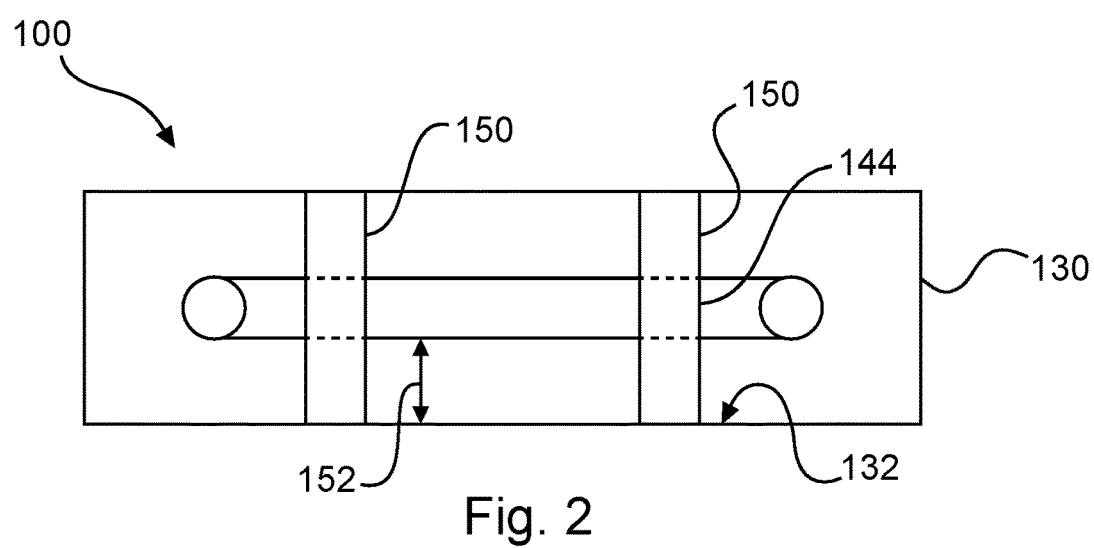
FIG. 2 shows a schematic illustration of a plan view of a connecting unit according to a further exemplary embodiment.

FIG. 2 shows a plan view of the connecting unit 100 from FIG. 1, wherein FIG. 2 shows a view into the housing 130. However, spacers 150, which are not illustrated in FIG. 1 for reasons of clarity, are also shown in FIG. 2.

The second section 144 of the internal conductor 140 extends from left to right in the longitudinal direction of the housing 130. Two spacers 150 are provided and arranged to hold and to fix the internal conductor in a desired position. The two spacers 150 are spaced apart from one another in the longitudinal direction of the second section 144. The spacers 150 ensure that the second section 144 (and respectively the internal conductor 140 in general) is kept at a distance 152 from the two opposite side walls 132 of the housing 130. The internal conductor 140 is preferably routed centrally between the two side walls 132, that is to say that the distance 152 between the internal conductor and the two side walls is the same.

It can be seen that the spacers 150 have a width which corresponds to the distance between the two opposite side walls of the housing 130. The spacers 150 can be manufactured from an elastically deformable material. In this case, the spacers 150, in an initial state, can have a greater extent than the distance between the opposite side walls. In a subsequent step, the internal conductor is routed through a recess of the spacer and the spacer is laterally compressed and placed in the housing 130.

In principle, a spacer can be formed in a disc shape or plate shape and have a central recess or an aperture through which the internal conductor is routed. The outline, that is to say, the outer shape, of the spacer preferably corresponds substantially to a shape of the cross section of the housing 130. Spacers can be arranged on each section of the internal conductor 140. However, a spacer which is arranged on the first section 142 (FIG. 1) or third section 146 (FIG. 1) of the internal conductor has a different orientation to that of the spacers which are arranged on the second section 144.

Figure 3:
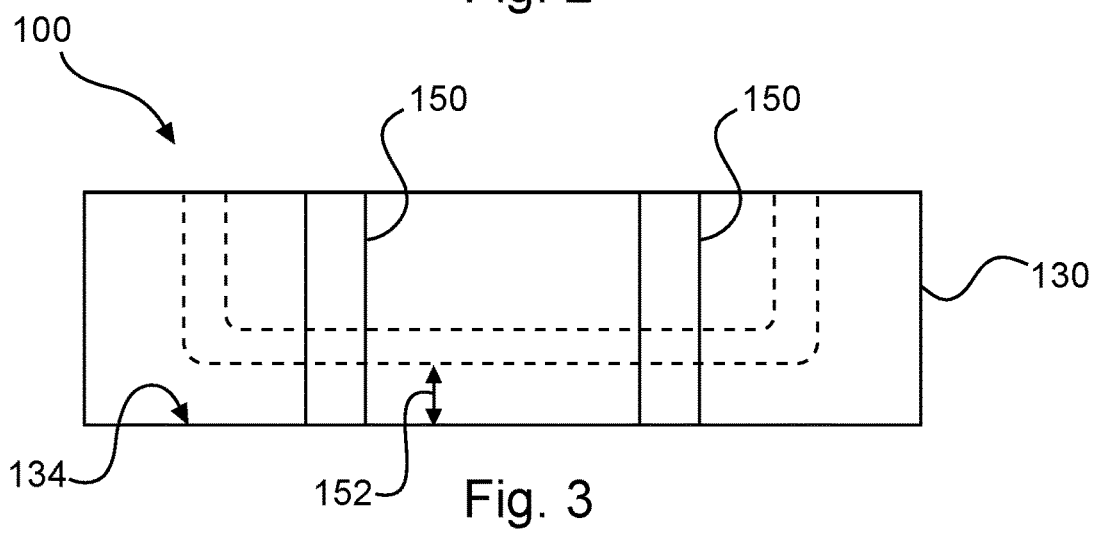
FIG. 3 shows a schematic illustration of a side view of a connecting unit according to a further exemplary embodiment.

FIG. 3 shows a side view of the illustration from FIG. 2. The internal conductor is illustrated using dashed lines. The spacers 150 are shown using solid lines, even if they are located behind the front side wall of the housing 130 in the side view.

The spacers 150 hold the internal conductor such that a distance 152 is kept between the second section 144 and the bottom wall 134 of the housing 130.

Figure 4:
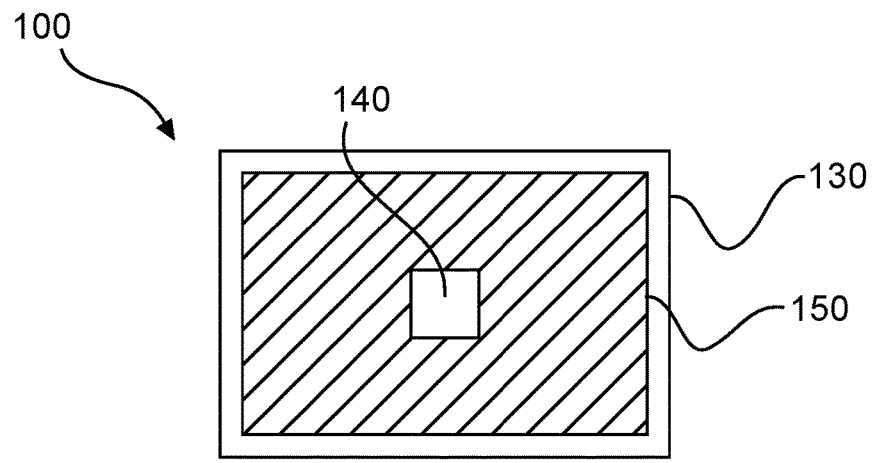
FIG. 4 shows a schematic illustration of a front view of a connecting unit according to a further exemplary embodiment.

FIG. 4 shows a front view from the left and, respectively, from the right in relation to the illustrations of FIG. 2 and FIG. 3. For reasons of clarity, only the cross section of the second section 144 of the internal conductor 140 is shown in FIG. 4. The spacer 150 surrounds the internal conductor 140 and in this way ensures that the internal conductor 140 is kept at a desired distance from the side walls, the bottom wall and the top wall of the housing.

In FIG. 4, the spacer 150 is drawn such that a small distance from the walls of the housing 130 can be seen. However, this is done only for reasons of clarity. In actual fact, the spacer 150 at least bears against some of the walls of the housing.

Even though individual spacers 150 which are spaced apart from one another are shown in FIGS. 2 to 4, an individual spacer which surrounds a major portion or the entire length of the internal conductor and is fixed in the housing can also be provided. It is conceivable, for example, that the internal conductor is arranged in the housing and then the interior of the housing is filled with a foam or another flowable or shapeable material which then cures and as a result holds the internal conductor in the original position.

The spacer is electrically insulating and can be, in particular, a plastic, a polyether ketone (PEK) or a polytetrafluoroethylene (PTFE, also available under trade names, such as FLUOROLOY® and TEFLON®).

In addition, the internal conductor 140 does not require a further insulating layer which directly surrounds it. Therefore, the internal conductor may be one or more non-insulated metal bars. The internal conductor can be referred to as a "cable" or a "line".

Figure 5:
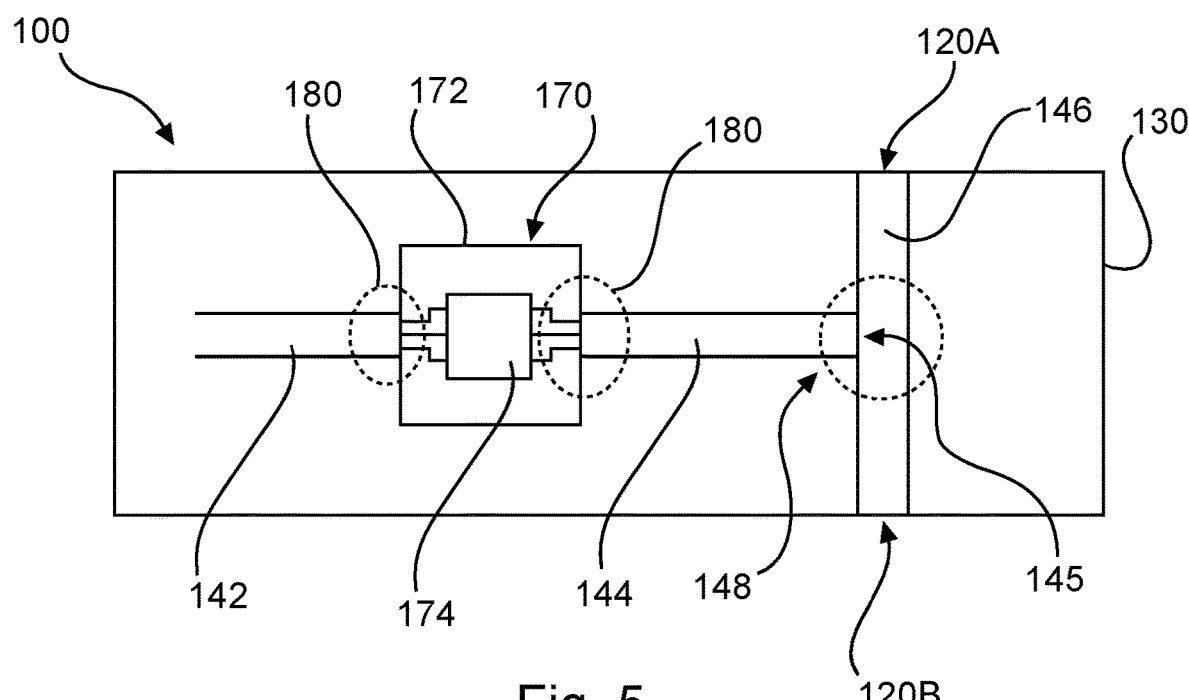
FIG. 5 shows a schematic illustration of a plan view of a connecting unit according to a further exemplary embodiment.

FIG. 5 shows an illustration of the connecting unit 100 in which a radio-frequency component 170 is provided in the housing 130 and, in addition, the internal conductor is provided with a branch 148.

The radio-frequency component 170 can be a power amplifier which is based on semiconductor elements. The semiconductor elements of the power amplifier 174 are arranged on a printed circuit board 172. Electrically conductive strips or conductor tracks which allow the power amplifier 174 to be electrically connected to the internal conductor are located on the printed circuit board 172. The first section 142 of the internal conductor is electrically connected to the conductor tracks in a joining region 180. These conductor tracks establish an electrical connection between the first section 142 and the power amplifier 174. On the other side, the power amplifier 174 is electrically connected to the second section 144 likewise by means of conductor tracks, wherein this connection likewise takes place in a joining region 180.

Furthermore, FIG. 5 shows that the second section 144 is routed in a branch 148 to the third section 146. The branch 148 can be referred to as a T-shaped branch because, starting from the second section 144, two possible signal taps are provided by means of the third section 146. Reference symbols 120A, 120B show two interfaces at which a signal can be output.

A connection 145 which can be a connection as described above is provided at the branch 148.

The power amplifier 174 can also be referred to as an "output stage" or an "amplifier output stage". A network for power combination based on the described technology can be fitted at the output of the amplifier output stages. The network can then be connected to further modules, or can be provided with a transition to coaxial plugs or waveguides in order to provide a desired interface.

If output stages with a power distributor network at the input and output are used, the part (a preamplifier) which is connected to the input and the part (a waveguide transition/insulator) which is connected to the output can remain unchanged. The output power can be changed by exchanging the output stage modules, without the other components which are involved having to be changed. In these cases, the internal conductor can be divided into a plurality of parts for better integration and can be recombined by plug-in or screw connections.

Instead of a direct power combination at the output (for example 4-to-1 connection), each output stage can also be routed to a waveguide transition and insulator (with a 1-to-1 connection using the described connection technology) and then the outputs of the insulators can be combined by means of power combination to form a waveguide network.

Figure 6:
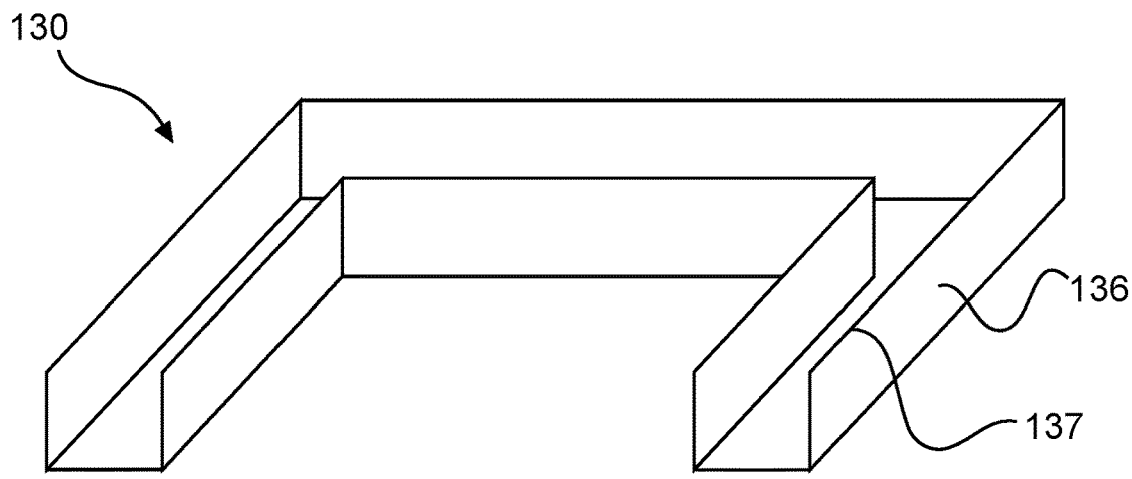
FIG. 6 shows a schematic illustration of a half-shell of a connecting unit according to a further exemplary embodiment.

FIG. 6 shows an isometric illustration of a half-shell 136 for the housing 130. This half-shell has a U-shaped form and the internal conductor (not shown) extends through the interior of the half-shell. A second half-shell (not shown) of the same form is provided and can be positioned, for example as a cover, onto the half-shell shown in order to render the housing in a closed form. The edge of the half-shell, which is connected to the second half-shell, can be referred to as a joint or joining edge 137. The two half-shells can be connected to one another by means of releasable or non-releasable connections. For example, it is possible to connect the two half-shells to one another by means of click connections or snap-action connections. It is also possible to connect the half-shells to one another by means of material-bonding connections, provided that these connections are suitable for the intended use of the connecting unit.

Figure 7:
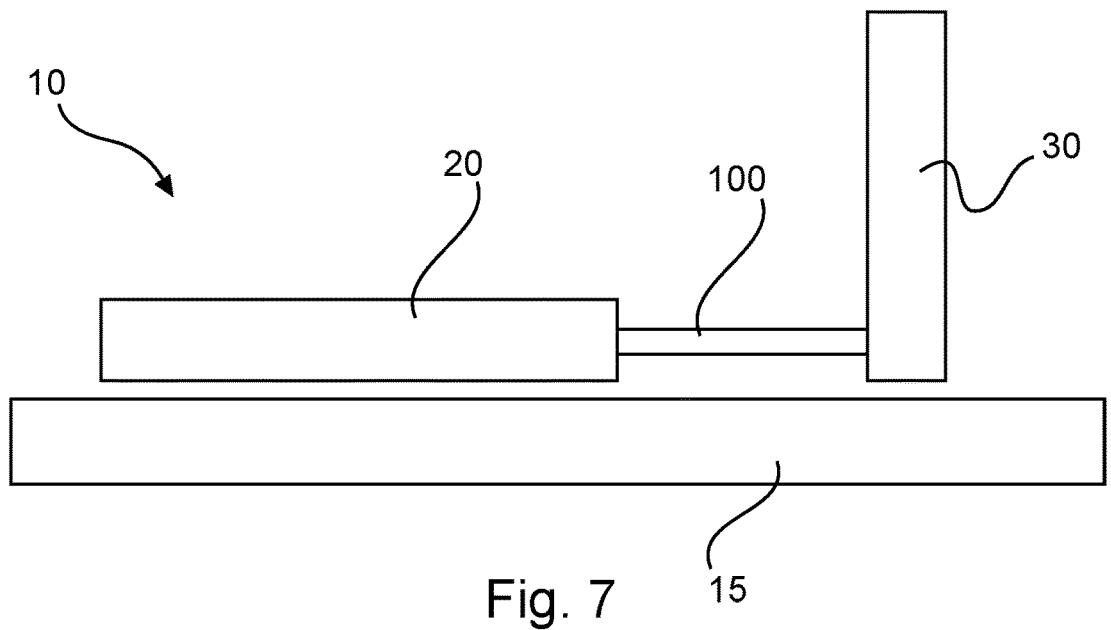
FIG. 7 shows a schematic illustration of a radio-frequency unit according to a further exemplary embodiment.
Figure 11:
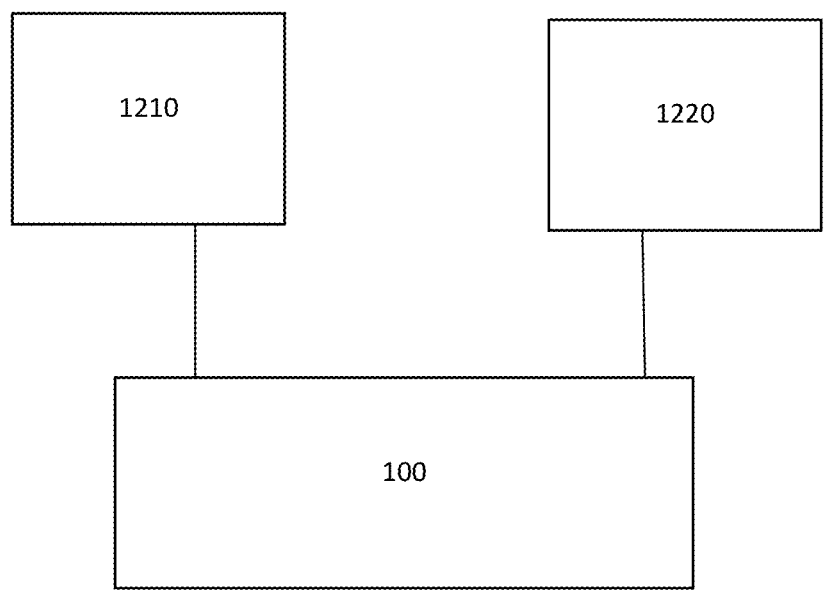
FIG. 11 shows a schematic illustration the connecting unit of FIG. 1 connecting a preamplifier and a power amplifier.

FIG. 7 shows a radio-frequency unit 10 comprising a bottom plate 15 and two radio-frequency components 20, 30 which are arranged on the bottom plate 15. The two radio-frequency components 20, 30 are connected to a connecting unit 100 as described above and in the description which follows. FIG. 11 schematically shows the connecting unit 100 connecting a first radio-frequency component in the form of a preamplifier 1210 and a second radio-frequency component in the form of a power amplifier 1220.

The radio-frequency component 20 is mounted horizontally on the bottom plate 15 and the radio-frequency component 30 is mounted vertically on the bottom plate 15. One reason for this different manner of mounting can be that a higher thermal load has to be dissipated by the radio-frequency component 20. Since the radio-frequency component 20 is mounted on the bottom plate 15 by way of the largest outer face thereof, a higher amount of thermal energy can be dissipated from the radio-frequency component 20 into the bottom plate 15 by means of thermal conduction into solid bodies. This may be advantageous or even necessary, in particular, when used in a vacuum. In comparison to this, the radio-frequency component 30 requires a lower amount of heat dissipation, and therefore the radio-frequency component 30 is mounted vertically. As a result, the surface of the bottom plate 15 can be utilized more efficiently and more effectively. The connecting unit 100 allows radio-frequency components to be connected to one another independently of the spatial arrangement thereof.

The mechanical or thermal requirements of the respective device 20, 30 can render specific positioning necessary. Devices with a high level of power loss generally have to be accommodated flat or horizontally on the mounting face or bottom plate (in order to thermally dissipate lost power). Devices with a low level of power loss are placed in an elevated manner horizontally or in a second plane, that is to say above the radio-frequency component 20 in order to save surface area.

The housing of the connecting unit 100 described in this document can be mechanically and thermally connected to the housing of the radio-frequency components to be connected. In addition, the connecting unit is distinguished by low losses and flexible configuration of the shape of the housing, so that components which are arranged in any desired manner in principle can be connected to one another. Branches are also possible.

Figure 8:
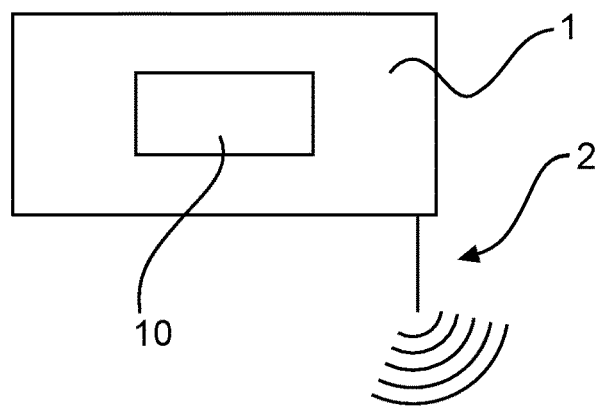
FIG. 8 shows a schematic illustration of a satellite according to a further exemplary embodiment.

FIG. 8 shows a schematic illustration of a satellite 1. A radio-frequency unit 10 is arranged in the satellite 1. The radio-frequency unit 10 can be a constituent part of a signal transmission path. For example, the radio-frequency unit 10 can be part of a control unit or the signal-processing arrangement for a transmission unit 2, wherein the transmission unit 2 is, for example, an antenna.

It should also be noted that the terms "comprising" or "having" do not rule out any other elements or steps and the terms "one" or "a" do not rule out a greater number. In addition, it should be noted that features or steps which have been described with reference to one of the above exemplary embodiments can also be used in combination with other features or steps of other above-described exemplary embodiments. The reference symbols in the claims should not be considered as any form of restriction.

LIST OF REFERENCE SYMBOLS

1 Satellite
2 Transmission unit, antenna
10 Radio-frequency unit
15 Bottom plate
20 First component
30 Second component
100 Connecting unit
110 First interface
120 Second interface
130 Housing
132 Side wall
134 Bottom wall
136 Half-shell
137 Joint, joining edge
140 Internal conductor
142 First section
143 Connection
144 Second section
145 Connection
146 Third section
148 Branch
150 Spacer
152 Distance
170 Radio-frequency component 172 Printed circuit board
174 Power amplifier
180 Joining region While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A connecting unit for radio-frequency components, comprising:
    a housing;
    a first interface and a second interface arranged on the housing and configured to be coupled to a first radio-frequency component and a second radio-frequency component, respectively;
    an internal conductor located within the housing and connected to the first interface and the second interface in order to establish a radio-frequency connection between the first interface and the second interface; and
    a spacer surrounding the internal conductor and extending at least along a portion of the length of the internal conductor,
    wherein the housing is manufactured from a first electrically conductive and rigid material,
    wherein the spacer is arranged such that the internal conductor is at a distance from the housing,
    wherein the internal conductor comprises at least two subsections connected to one another by a connection,
    wherein the connection is a force-fitting or frictional connection, and
    wherein the housing comprises two half-shells connected to one another along a joint.

2. The connecting unit according to claim 1, wherein the first electrically conductive and rigid material of the housing is at least partially composed of aluminum.

3. The connecting unit according to claim 1, wherein the internal conductor is composed of a second electrically conductive material, and
    wherein the second electrically conductive material of the internal conductor contains at least one of the following materials or a combination of the said materials: aluminum, brass, copper, silver, or gold.

4. The connecting unit according to claim 3, wherein a surface of the internal conductor is coated with a layer of silver or gold.

5. A radio-frequency unit, comprising:
    the first radio-frequency component and the second radio-frequency component; and
    the connecting unit according to claim 1;
    wherein the connecting unit electrically connects the first radio-frequency component and the second radio-frequency component to one another.

6. The radio-frequency unit according to claim 5, wherein the first radio-frequency component is a preamplifier and the second radio-frequency component is a power amplifier.

7. A satellite comprising a radio-frequency unit according to claim 5.

8. The connecting unit according to claim 1, wherein the spacer contains an electrically insulating material.

9. The connecting unit according to claim 8, wherein the electrically insulating material of the spacer is a plastic, a polyether ketone or a polytetrafluoroethylene.

10. The connecting unit according to claim 1, further comprising a third radio-frequency component located in the housing and arranged between two of the at least two subsections of the internal conductor and also electrically connected to the two of the at least two subsections.

11. The connecting unit according to claim 1,
    wherein the first interface is a coaxial connector or a waveguide, and
    wherein the second interface is a coaxial connector or a waveguide.

* * * * *